(12) United States Patent
Su et al.

(10) Patent No.: US 11,088,287 B2
(45) Date of Patent: Aug. 10, 2021

(54) THIN FILM TRANSISTOR AND MANUFACTURING METHOD THEREOF, ARRAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tongshang Su, Beijing (CN); Dongfang Wang, Beijing (CN); Qinghe Wang, Beijing (CN); Liangchen Yan, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 32 days.

(21) Appl. No.: 16/429,528

(22) Filed: Jun. 3, 2019

(65) Prior Publication Data

US 2020/0035841 A1 Jan. 30, 2020

(30) Foreign Application Priority Data

Jul. 27, 2018 (CN) .......................... 201810840346.0

(51) Int. Cl.
*H01L 29/04* (2006.01)
*H01L 29/786* (2006.01)
*H01L 27/12* (2006.01)
*H01L 29/66* (2006.01)

(52) U.S. Cl.
CPC .... *H01L 29/78696* (2013.01); *H01L 27/1288* (2013.01); *H01L 29/66742* (2013.01)

(58) Field of Classification Search
CPC ......... H01L 29/78696; H01L 29/66742; H01L 27/1288
See application file for complete search history.

(56) References Cited

U.S. PATENT DOCUMENTS

2017/0278974 A1* 9/2017 Yoshitani et al. .... H01L 29/517

* cited by examiner

*Primary Examiner* — Samuel A Gebremariam
(74) *Attorney, Agent, or Firm* — Brooks Kushman P.C.

(57) ABSTRACT

A TFT and a method for manufacturing the TFT, an array substrate, and a display device are provided. An active layer of the TFT includes a channel region, a first conductive region and a second conductive region, and the channel region is arranged between the first conductive region and the second conductive region. The channel region includes a first side and a second side, the first side is opposite to the second side, the first side is in contact with a third side of the first conductive region, the second side is in contact with a fourth side of the second conductive region, and a length of the first side is greater than a length of the third side.

20 Claims, 7 Drawing Sheets

THIN FILM TRANSISTOR AND MANUFACTURING METHOD THEREOF, ARRAY SUBSTRATE AND DISPLAY DEVICE

CROSS-REFERENCE TO RELATED APPLICATION

This application claims priority to Chinese Patent Application No. 201810840346.0 filed on Jul. 27, 2018, which is incorporated herein by reference in its entirety.

TECHNICAL FIELD

The present disclosure relates to the field of display technology, in particular to a Thin Film Transistor (TFT) and a manufacturing method thereof, an array substrate and a display device.

BACKGROUND

TFTs have been widely used due to their advantages such as a fine manufacturing process and small parasitic capacitance between a gate electrode and a source electrode/a drain electrode. However, in a conventional TFT, due to a restriction of the manufacturing process, a conductive phenomenon easily occurs in a channel region of the TFT, and thus a product yield is low, thereby limiting its application.

Therefore, the conventional TFTs still need to be improved.

SUMMARY

In one aspect, the present disclosure provides a TFT. According to an embodiment of the present disclosure, the TFT includes an active layer. The active layer includes a channel region, a first conductive region and a second conductive region, and the channel region is arranged between the first conductive region and the second conductive region. The channel region includes a first side and a second side, the first side is opposite to the second side, the first side is in direct physical contact with a third side of the first conductive region, the second side is in direct physical contact with a fourth side of the second conductive region, and a length of the first side is greater than a length of the third side.

According to an embodiment of the present disclosure, an entirety of the third side is in direct physical contact with the first side.

According to an embodiment of the present disclosure, a length of the second side is greater than a length of the fourth side.

According to an embodiment of the present disclosure, an entirety of the fourth side is in direct physical contact with the second side.

According to an embodiment of the present disclosure, the length of the second side is equal to the length of the fourth side.

According to an embodiment of the present disclosure, an entirety of the fourth side is in direct physical contact with the second side.

According to an embodiment of the present disclosure, the length of the third side is equal to the length of the fourth side.

According to an embodiment of the present disclosure, the length of the third side is not equal to the length of the fourth side.

According to an embodiment of the present disclosure, an orthographic projection of the third side onto the fourth side coincides with the fourth side.

According to an embodiment of the present disclosure, the TFT further includes: a base, wherein the active layer is arranged on a surface of the base; a gate insulation layer arranged on a surface of the channel region distal to the base; a gate electrode arranged on a surface of the gate insulation layer distal to the channel region; an insulation interlayer, wherein the insulation interlayer is arranged on the surface of the base, and covers the active layer, the gate insulation layer, and the gate electrode; a source electrode and a drain electrode arranged on a surface of the insulation interlayer distal to the base, wherein the source electrode is electrically connected to the first conductive region through a first via hole, and the drain electrode is electrically connected to the second conductive region through a second via hole; and a passivation layer, wherein the passivation layer is arranged on a surface of the insulation interlayer distal to the base, and covers the source electrode and the drain electrode.

In another aspect, the present disclosure provides a method for manufacturing the above TFT. According to an embodiment of the present disclosure, the method includes forming the active layer of the TFT, and the step of forming the active layer of the TFT includes: forming a semiconductor pattern layer on a surface of the base by a first patterning process; forming a gate insulation layer and a gate electrode by a second patterning process, wherein the gate insulation layer is arranged on a surface of the semiconductor pattern layer distal to the base, and the gate electrode is arranged on a surface of the gate insulation layer distal to the base; subjecting a portion of the semiconductor pattern layer not covered by the gate insulation layer to a conductivity-enabling process, to enable the portion of the semiconductor pattern layer to be conductive.

According to an embodiment of the present disclosure, the second patterning process includes: depositing an insulation layer on the surface of the base, wherein the insulation layer covers the semiconductor pattern layer; depositing a conductive layer on a surface of the insulation layer distal to the base; subjecting the insulation layer and the conductive layer to a patterning process by using a same mask.

According to an embodiment of the present disclosure, the method for manufacturing the TFT further includes: depositing an insulation interlayer on the surface of the base, wherein the insulation interlayer covers the active layer, the gate insulation layer, and the gate electrode; etching the insulation interlayer to form a first via hole and a second via hole; forming a source electrode and a drain electrode on a surface of the insulation interlayer distal to the base by a third patterning process, wherein the source electrode is electrically connected to the first conductive region through the first via hole, and the drain electrode is electrically connected to the second conductive region through the second via hole; and depositing a passivation layer on a surface of the insulation interlayer distal to the base, wherein the passivation layer covers the source electrode and the drain electrode.

In yet another aspect, the present disclosure provides an array substrate. According to an embodiment of the present disclosure, the array substrate includes the above TFT.

In yet another aspect of the present disclosure, the present disclosure provides a display device. According to an embodiment of the present disclosure, the display device includes the above array substrate.

DETAILED DESCRIPTION

Embodiments of the present disclosure are described in detail below. The embodiments described below are illustrative only and are not to be construed as limiting the present disclosure.

Figure 1:
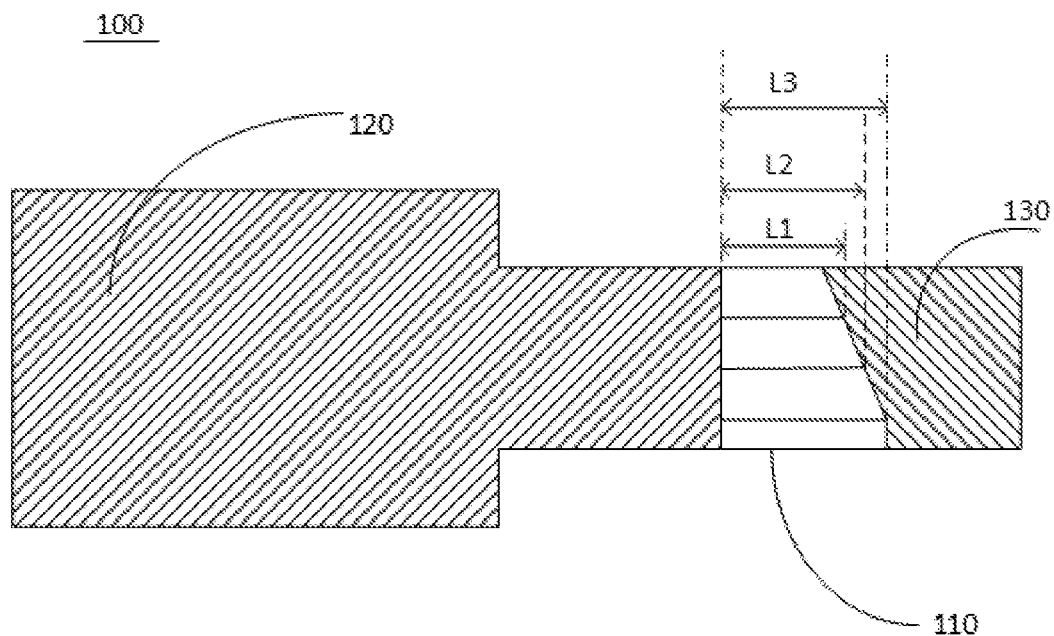
FIG. 1 is a schematic structural diagram of an active layer in a TFT in related art.

In the related art, in a top-gate-type TFT (FIG. 1 shows a specific structure of the active layer in the top-gate-type TFT), when a first conductive region 120 and a second conductive region 130 are subjected to a conductivity-enabling process to enable the first conductive region 120 and the second conductive region 130 to be conductive, due to non-uniformity of the conductivity (for example, non-uniformity caused by non-uniformity of diffusion of conductive ions during the conductivity-enabling process or non-uniformity of an etching of a gate electrode and a gate insulation layer serving as a mask), lengths of the channel region 110 are different in a direction of a width of the channel region 110 (for example, the lengths of the channel region 110 are L1, L2, L3, . . . at different positions), and the actual channel length $L_{effect}$ is determined by the shortest channel length $L_{min}$, that is, $L_{effect}=L_{min}$ (L1, L2, L3 . . . ). In addition, because the charge carrier in the conductive region will diffuse into the channel region, the threshold voltage (Vth) of the top-gate-type TFT is poorly uniform, even the channel will be enabled to be conductive. In addition, in the related art, the conductive ions are easily diffused into the channel region during the conductivity-enabling process of the active layer enabling the active layer to be conductive, resulting in non-uniformity of the conductivity-enabling process, and the contact distance between the conductive region of the active layer and the channel region is long, the long contact distance may increase the probability that the above-described non-uniformity of the conductivity-enabling process occurs. Therefore, the above problem can be solved by shortening the contact distance between the conductive region and the channel region.

Figure 2:
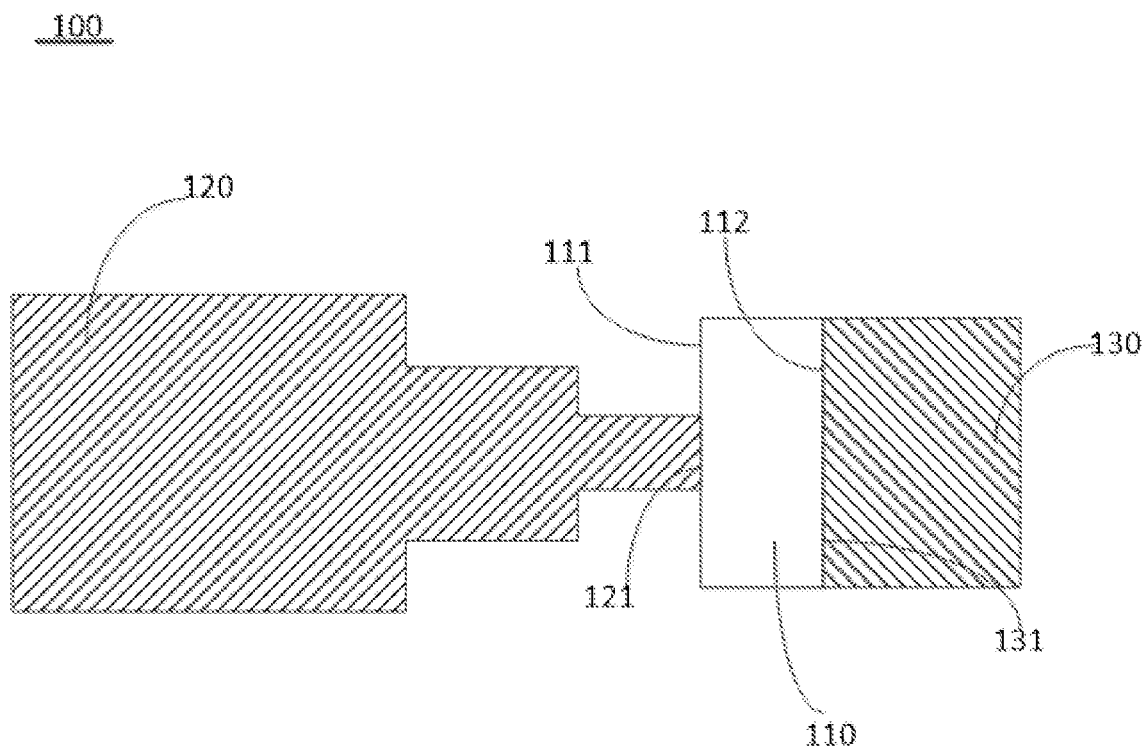
FIG. 2 is a schematic structural diagram of an active layer in a TFT according to an embodiment of the present disclosure.

In view of this, in one aspect of the present disclosure, a TFT is provided in the present disclosure. According to some embodiments of the present disclosure, as shown in FIG. 2, the active layer 100 of the TFT includes a channel region 110, a first conductive region 120, and a second conductive region 130, and the channel region 110 is arranged between the first conductive region 120 and the second conductive region 130. The channel region 110 includes a first side 111 and a second side 112 opposite to each other, the first side 111 is in contact with a third side 121 of the conductive region 120, the second side 112 is in contact with a fourth side 131 of the second conductive region 130, and a length of the first side 111 is greater than a length of the third side 121. The TFT is of a fine structure and is easy to implement and has a high yield and has a short contact distance between the channel region and the first conductive region. As a result, the probability of the non-uniformity of the conductivity during the conductivity-enabling process is low, and the length of the channel region in a direction along the first side 112 of the channel region is relatively uniform, so that the threshold voltage of the TFT is relatively uniform, and the channel region is almost non-conductive. Therefore, the TFT is sensitive and has good performance.

In some embodiments of the present disclosure, in order to achieve an effect of reducing a contact distance between the channel region and the conductive region, as shown in FIG. 2, an entirety of the third side 121 of the first conductive region 120 is in contact with the first side 111 of the channel region 110. The structure is fine and easy to implement.

Figure 3:
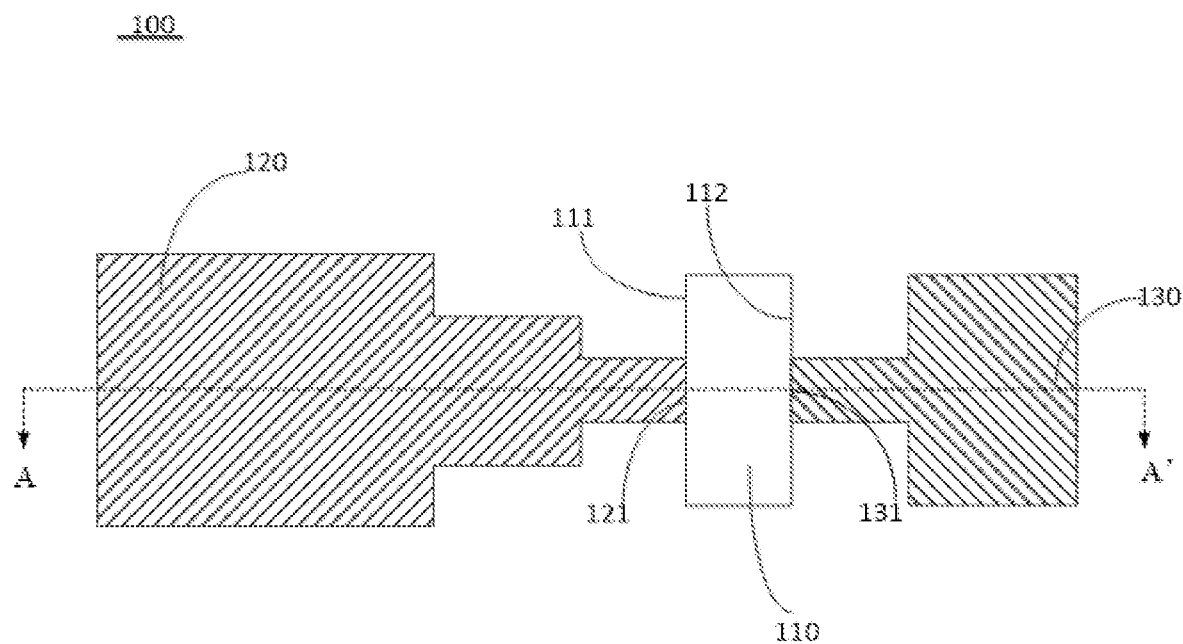
FIG. 3 is a schematic structural diagram of an active layer in a TFT according to another embodiment of the present disclosure.

In some embodiments of the present disclosure, as shown in FIG. 3, in order to make an effect of reducing the contact distance between the channel region and the conductive region better, a length of the second side 112 of the channel region 110 is greater than a length of the fourth side 131 of the second conductive region 130. Thereby, the contact distance between the channel region and the conductive region is small, so that the probability of the non-uniformity of the conductivity during the conductivity-enabling process is low, and the length of the channel region along a direction of the first side or the second side is uniform. In some embodiments of the present disclosure, as shown in FIG. 3, an entirety of the fourth side 131 is in contact with the second side 112. Thereby, the structure is fine and easy to implement. In addition, in some embodiments of the present disclosure, as shown in FIG. 3, the third side 121 and the fourth side 131 may align with each other; in other words, in the top view of FIG. 3, an orthographic projection of the third side 121 onto the fourth side 131 may coincide with the fourth side 131.

Figure 4:
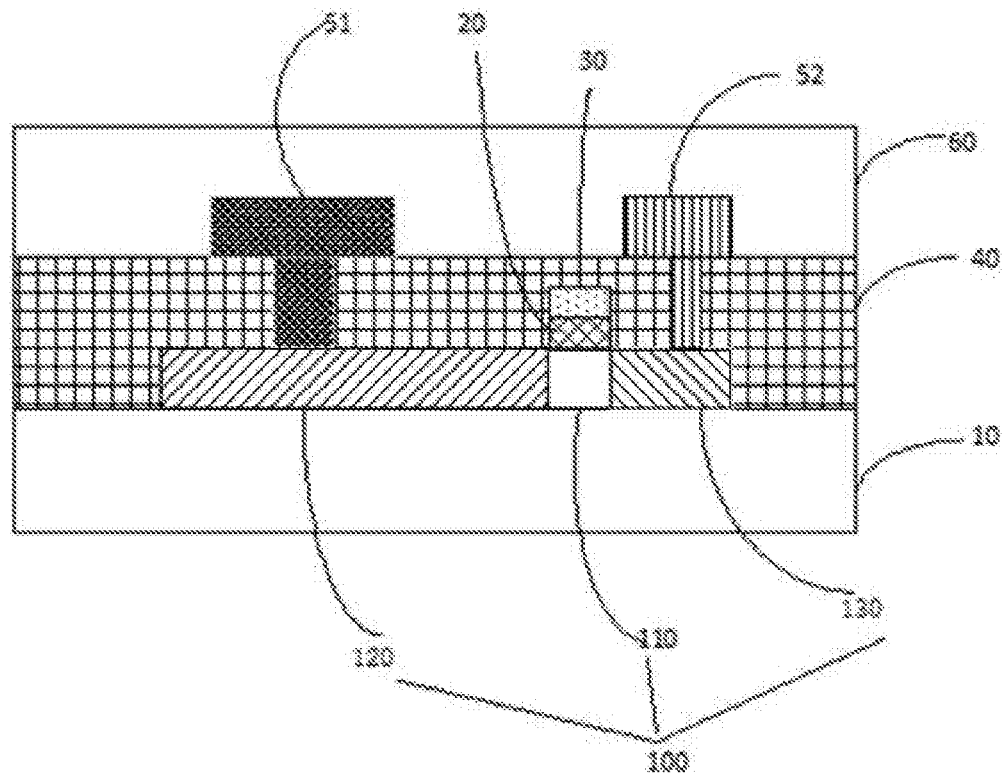
FIG. 4 is a cross-sectional view of a TFT along a line AA' as shown in the schematic structural diagram of the active layer of FIG. 3 according to an embodiment of the present disclosure.

In some embodiments of the present disclosure, as shown in FIG. 4, which is a cross-sectional view of a TFT along a line AA' as shown in the schematic structural diagram of the active layer of FIG. 3, the TFT includes: a base 10, the active layer 100 arranged on an upper surface of the base 10; a gate insulation layer 20 arranged on the upper surface of the channel region 110; the gate electrode 30 arranged on the upper surface of the gate insulation layer 20; the insulation interlayer 40 arranged on the upper surface of the base 10 and covering the active layer 100, the gate insulation layer 20 and the gate electrode 30; a source electrode 51 and a drain electrode 52 arranged on the upper surface of the insulation interlayer 40 and electrically connected to the first conductive region 120 and the second conductive region 130 through via holes respectively; a passivation layer 60 arranged on the upper surface of the insulation interlayer 40 and covering the source electrode 51 and the drain electrode 52. Thereby, the structure of the TFT is fine and easy to implement, and the threshold voltage of the TFT is relatively uniform, and the channel region is almost non-conductive.

Figure 9:
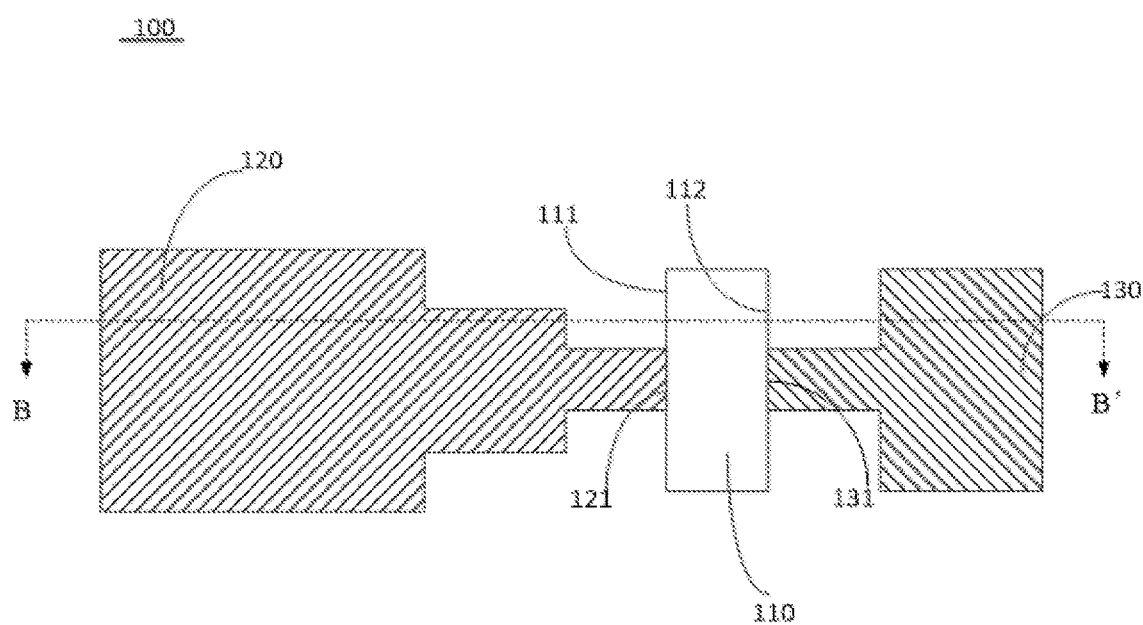
FIG. 9 is a schematic structural diagram of an active layer in a TFT according to yet another embodiment of the present disclosure.
Figure 10:
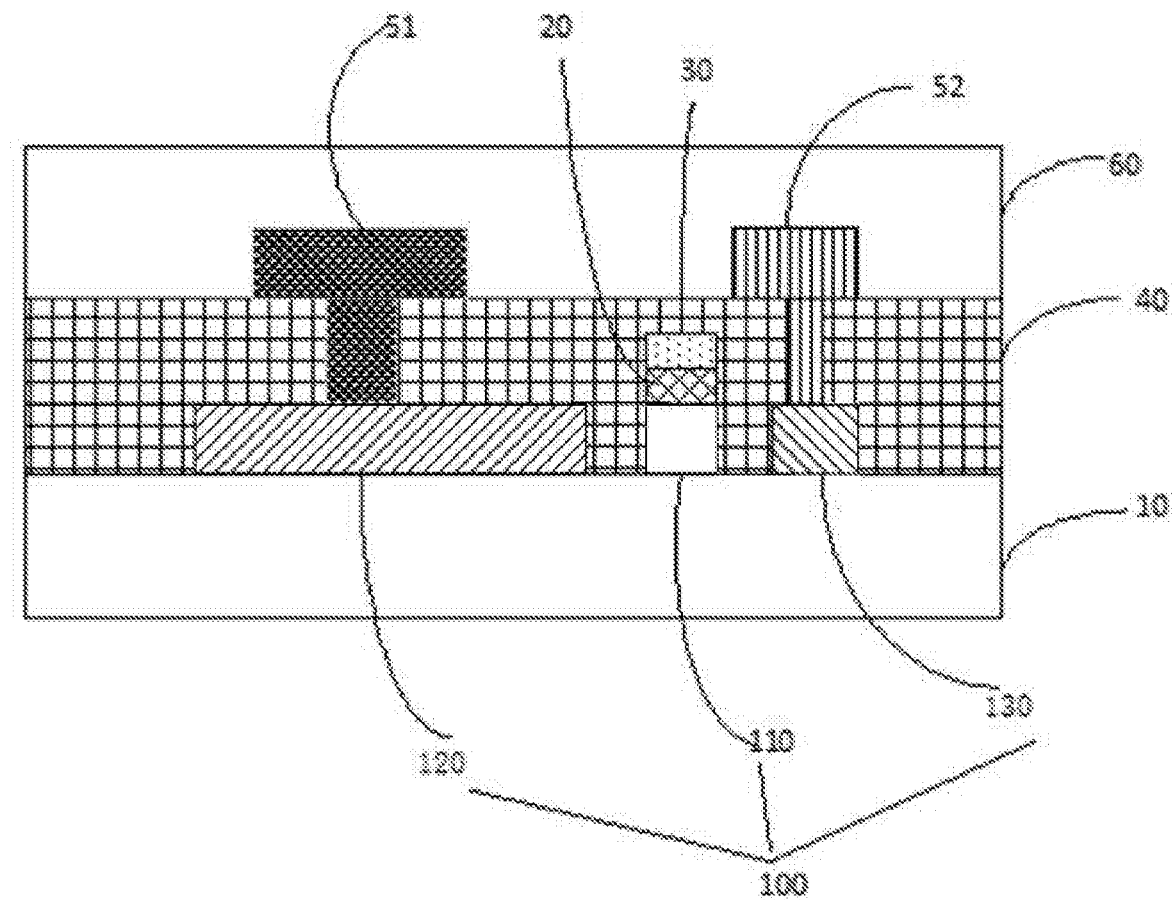
FIG. 10 is a cross-sectional view of a TFT along a line BB' as shown in the schematic structural diagram of the active layer of FIG. 9 according to an embodiment of the present disclosure.

In some embodiments of the present disclosure, as shown in FIG. 10, which is a cross-sectional view of a TFT along a line BB' as shown in the schematic structural diagram of the active layer of FIG. 9, some portions at two opposite sides of the channel region 110 are provided with portions of the insulation interlayer 40, instead of being provided with the portions of the first conductive region 120 and the second conductive region 130 as shown in the cross-sectional view of the TFT of FIG. 3.

Figure 11:
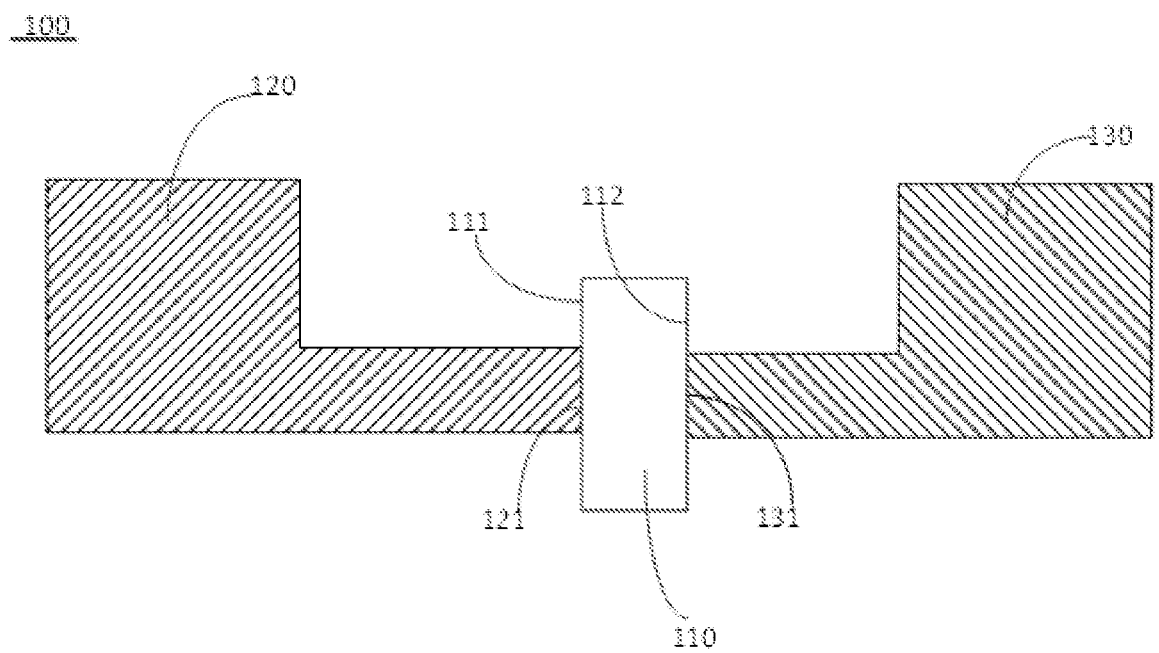
FIG. 11 is a schematic structural diagram of an active layer in a TFT according to yet another embodiment of the present disclosure.
Figure 12:
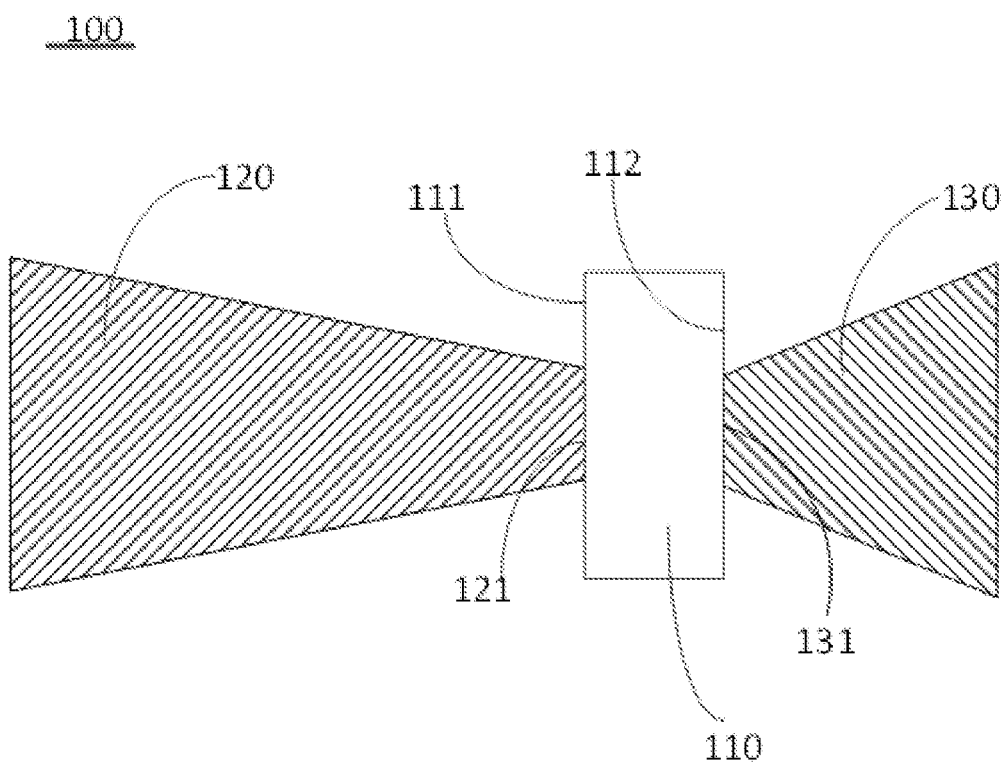
FIG. 12 is a schematic structural diagram of an active layer in a TFT according to yet another embodiment of the present disclosure.

It should be appreciated that, as shown in FIG. 3, each of patterns of the first conductive region 120 and the second conductive region 130 is of a stair-like shape; however, the present disclosure is not limited thereto. In some embodiments of the present disclosure, each of patterns of the first conductive region 120 and the second conductive region 130 may be of any other shape that gradually narrows in a direction toward the channel region 110, e.g., the "L" shape as shown In FIG. 11 or the trapezium as shown in FIG. 12. Further, the pattern of the first conductive region 120 and the pattern of the second conductive region 130 may not necessarily be a same type of shape. For example, the pattern of the first conductive region 120 may be of the "L" shape while the pattern of the second conductive region 130 may be of the trapezium, or the pattern of the first conductive region 120 may be of the trapezium while the pattern of the second conductive region 130 may be of the "L" shape.

Further, it should be appreciated that, as compared with a TFT in the related art, in the embodiments of the present disclosure, an on-off ratio of the TFT including the active layer 100 may not be adversely affected. More specifically, in some embodiments of the present disclosure, a width of the conductive region, instead of a width of the active layer with respect to a width-length ratio of the TFT, is changed; in addition, the on-off ratio of the TFT is proportional to the width-length ratio of the channel region. As a result, the on-off ratio of the TFT including the active layer 100 may not be adversely affected.

According to an embodiment of the present disclosure, a material forming the base may include, but is not limited to, glass or resin, etc.; a material forming the gate insulation layer may include, but is not limited to, silicon dioxide or doped silicon dioxide, etc.; the materials forming the gate electrode, the source electrode and the drain electrode may include, but are not limited to, a metal, a conductive metal oxide, etc.; a material forming the insulation interlayer and the passivation layer may include, but not limited to, silicon dioxide or doped silicon dioxide; Thus, the above-described structures formed using the above materials are preferable in performance.

Figure 5:
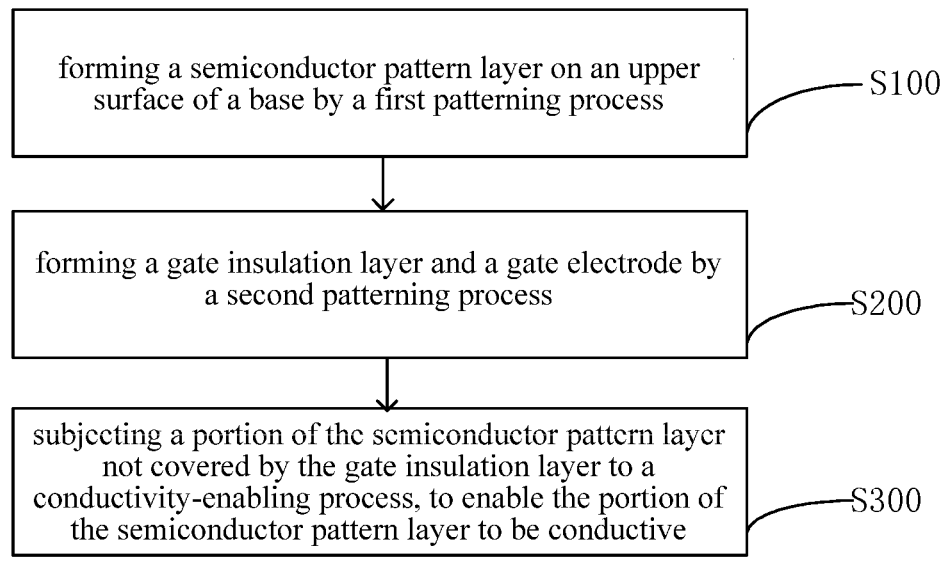
FIG. 5 is a schematic flow chart of a method for manufacturing a TFT according to an embodiment of the present disclosure.

In another aspect of the present disclosure, a method for manufacturing the TFT described above is provided. According to an embodiment of the present disclosure, as shown in FIG. 5, the TFT is formed by the following steps.

Step S100: forming a semiconductor pattern layer on an upper surface of a base by a first patterning process.

According to an embodiment of the present disclosure, the first patterning process includes: forming an entire semiconductor layer on the upper surface of the base, and subjecting the semiconductor layer to a patterning process, so as to obtain a semiconductor pattern layer. Thus, the operation is fine and easy to implement. In some embodiments of the present disclosure, the step of subjecting the semiconductor layer to the patterning process includes: coating a photoresist layer on the surface of the semiconductor layer distal to the base; exposing the photoresist layer using the mask; developing the exposed photoresist layer to form a pattern corresponding to the semiconductor pattern layer in the photoresist layer; etching the semiconductor layer with an etching solution to obtain a semiconductor pattern layer; removing the photoresist layer including the pattern. Thereby, the operation is fine, convenient, easy to implement, and a relatively accurate semiconductor pattern can be obtained. According to an embodiment of the present disclosure, a material forming the semiconductor pattern layer may include, but is not limited to, Indium Gallium Zinc Oxide (IGZO), amorphous silica (amorphous silicon/a-Si), polysilicon (P-Si), etc., and is preferable in performance.

Step S200: forming a gate insulation layer and a gate electrode by a second patterning process, the gate insulation layer is arranged on an upper surface of the semiconductor pattern layer, and the gate electrode is arranged on an upper surface of the gate insulation layer.

According to the embodiment of the present disclosure, the above-mentioned gate insulation layer and the gate electrode are same as those described above, and will not be repeatly described in detail herein.

Figure 6:
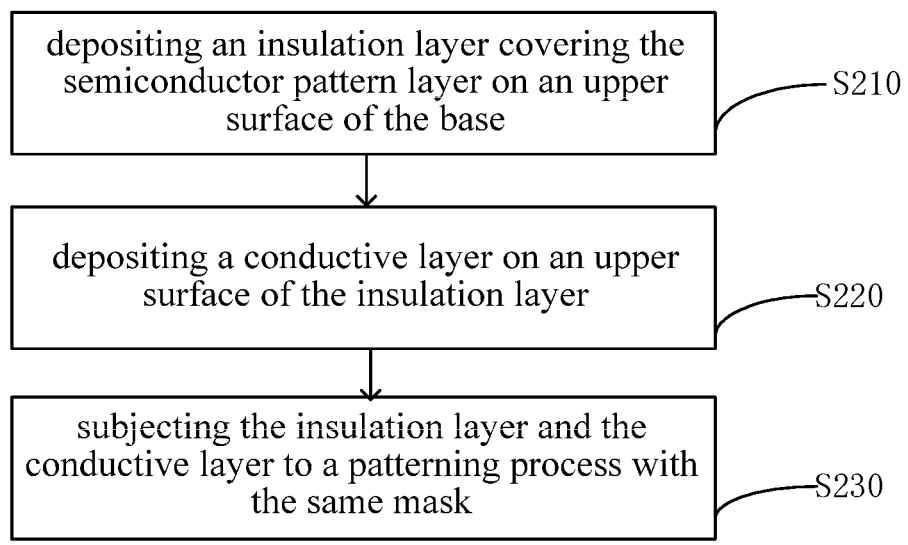
FIG. 6 is a schematic flow chart of a second patterning process according to an embodiment of the present disclosure.

According to an embodiment of the present disclosure, as shown in FIG. 6, the second patterning process includes following steps.

Step S210: depositing an insulation layer covering the semiconductor pattern layer on an upper surface of the base.

According to an embodiment of the present disclosure, a material forming the insulation layer includes, but is not limited to, silicon dioxide or doped silicon dioxide or the like. The material is widely available and easy to deposit. According to an embodiment of the present disclosure, the method of depositing the insulation layer may include, but is not limited to, chemical vapor deposition, magnetron sputtering, etc., and the operation is fine, convenient, and easy to implement.

Step S220: depositing a conductive layer on an upper surface of the insulation layer.

According to an embodiment of the present disclosure, a material forming the conductive layer includes, but is not limited to, a metal, a conductive metal oxide, or the like. As a result, the material is widely available and easy to deposit. According to an embodiment of the present disclosure, the method of depositing the conductive layer may include, but is not limited to, vacuum evaporation, magnetron sputtering, etc., and the operation is fine, convenient, and easy to implement.

Step S230: subjecting the insulation layer and the conductive layer to a patterning process with the same mask.

According to an embodiment of the present disclosure, the step of the patterning process may include: forming a photoresist layer on a surface of the conductive layer distal to the base; exposing the photoresist layer using the mask; and developing the exposed photoresist layer to form a pattern corresponding to the gate electrode and the gate insulation layer in the photoresist layer; etching the conductive layer and the insulation layer by an etching process to obtain the gate electrode and the gate insulation layer; and removing the photoresist. The above etching process includes, but is not limited to, wet etching, dry etching, etc., and the wet etching mainly uses an etching solution to etch the conductive layer (for example, an etching liquid selected for etching the conductive layer may be an acid solution) and the insulation layer (for example, an etching liquid selected for etching the gate insulation layer may be a hydrofluoric acid solution or the like), and the dry etching method includes, but not limited to, plasma etching. Thereby, the operation is fine, convenient, easy to implement, and a highly accurate gate electrode and a highly accurate gate insulation layer can be obtained.

Figure 8:
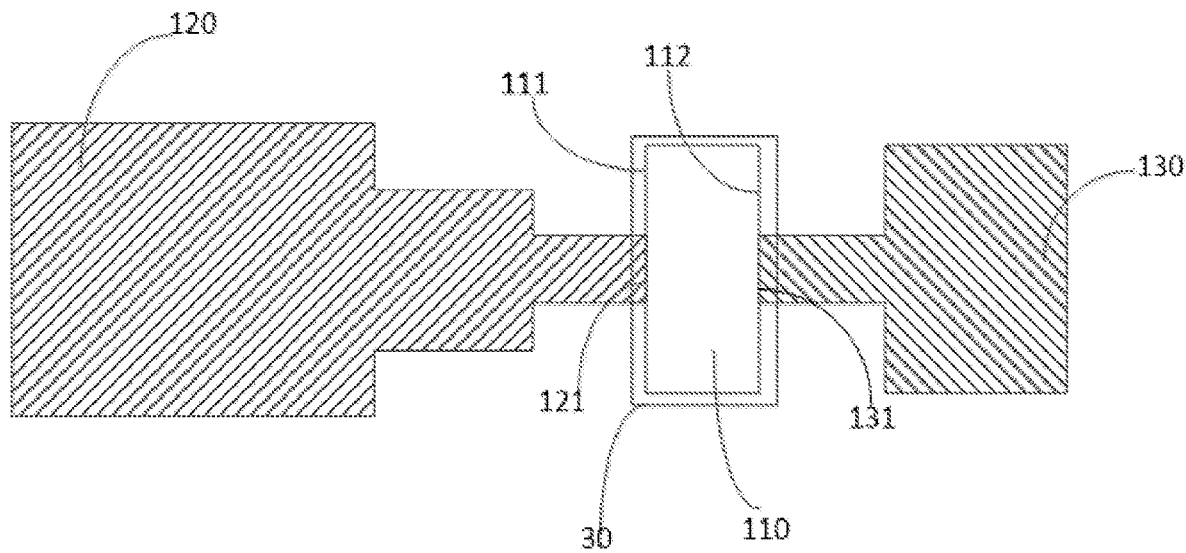
FIG. 8 is a schematic structural diagram of relative positions of an active layer and a gate electrode according to an embodiment of the present disclosure.

According to an embodiment of the present disclosure, as shown in FIG. 8, the gate insulation layer 20 and the gate electrode 30 may be formed after the above-described patterning process (since the gate electrode 30 is formed on the surface of the gate insulation layer 20 and covers the gate insulation layer 20, the gate insulation layer 20 is not shown in FIG. 8), and thus, the structure is fine and easy to implement.

Step S300: subjecting a portion of the semiconductor pattern layer not covered by the gate insulation layer to a conductivity-enabling process, to enable the portion of the semiconductor pattern layer to be conductive.

According to an embodiment of the present disclosure, the above-described conductivity-enabling process may be implemented by, but is not limited to, an ion implantation method, a He ion bombardment method, and etc., the operation is fine, convenient, easy to implement, and the conductivity-enabling process effect is preferable.

According to the embodiment of the present disclosure, the above method for manufacturing the TFT is fine, convenient, and easy to implement, and the TFT thus obtained has all the features and advantages of the TFT described above, and will not be repeatly described in detail herein.

Figure 7:
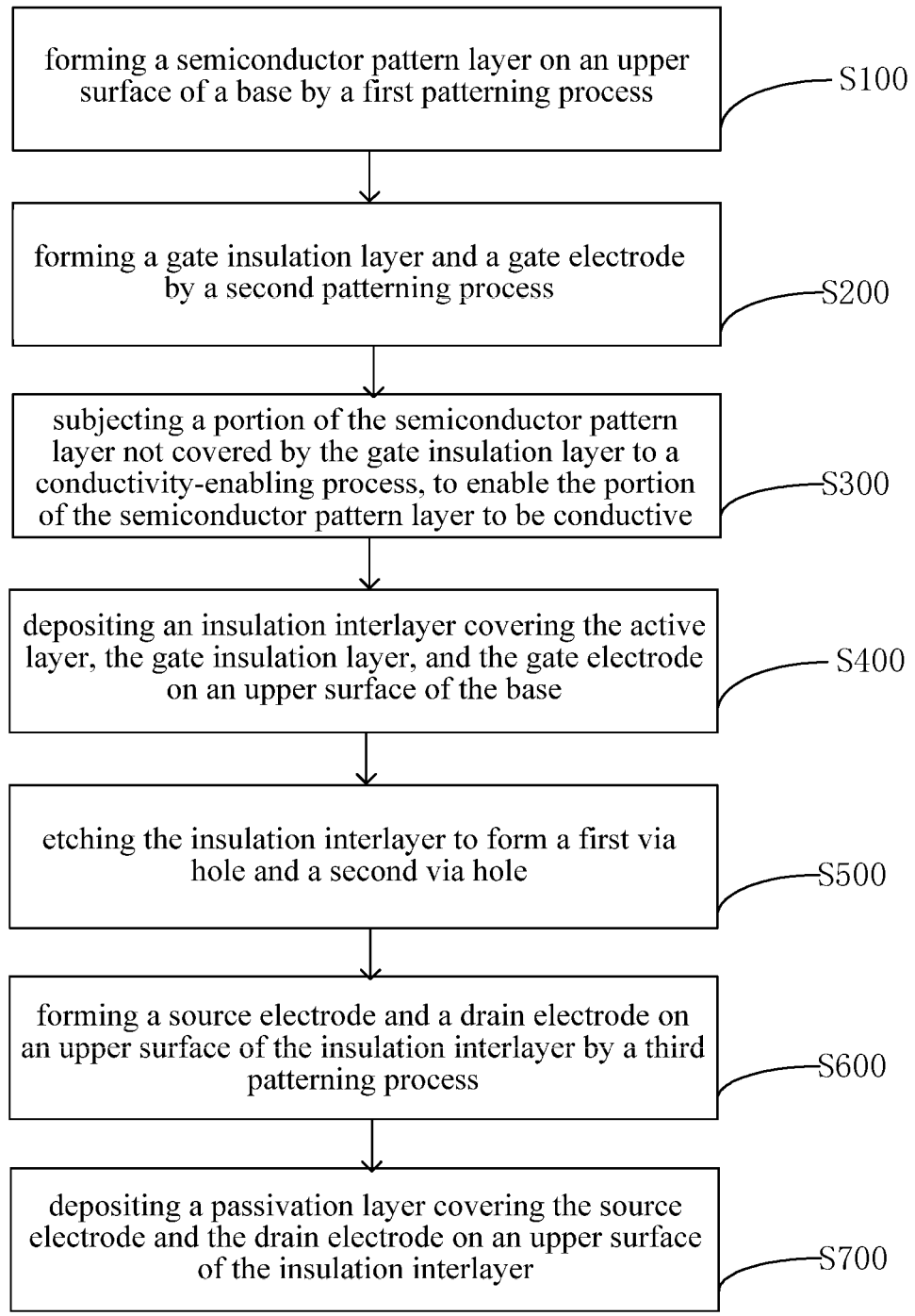
FIG. 7 is a flow chart showing a method for manufacturing a TFT in another embodiment of the present disclosure.

According to an embodiment of the present disclosure, as shown in FIG. 7, the method for manufacturing the TFT further includes following steps.

Step S400: depositing an insulation interlayer covering the active layer, the gate insulation layer, and the gate electrode on an upper surface of the base.

According to an embodiment of the present disclosure, the active layer, the gate insulation layer, and the insulation interlayer are same as those described above, and thus will not be repeatly described herein.

According to an embodiment of the present disclosure, a method of depositing an insulation interlayer includes, but is not limited to chemical vapor deposition, magnetron sputtering, atomic layer deposition, and the like. Thereby, the operation is fine, convenient, easy to implement, and an insulation interlayer having preferably performance can be obtained.

Step S500: etching the insulation interlayer to form a first via hole and a second via hole.

According to an embodiment of the present disclosure, the step of forming the first via hole and the second via hole may include: forming a photoresist layer on a surface of the insulation interlayer distal to the base; exposing the photoresist layer using a mask; developing the exposed photoresist layer to form a pattern corresponding to the first via hole and the second via hole in the photoresist layer; etching the insulation interlayer by an etching process to obtain the first via hole and the second via hole; and removing the photoresist. Thereby, the operation is fine, convenient, easy to implement, and the first via hole and the second via hole having high precision can be obtained.

Step S600: forming a source electrode and a drain electrode on an upper surface of the insulation interlayer by a third patterning process, wherein the source electrode and the drain electrode are electrically connected to the first conductive region and the second conductive region through the first via hole and the second via hole, respectively.

In accordance with an embodiment of the present disclosure, the source electrode and drain electrode are same as those described above, and thus will not be repeatly described herein.

According to an embodiment of the present disclosure, a method of forming the source electrode and the drain electrode may include: forming a metal layer on a surface of the insulation interlayer distal to the base; forming a photoresist layer on a surface of the metal layer distal to the base; exposing the photoresist layer using a mask; developing the exposed photoresist layer to form a pattern corresponding to the source electrode and the drain electrode in the photoresist layer; and etching the metal layer by using an etching process (for example, wet etching, dry etching, etc.) to obtain the source electrode and the drain electrode; and removing the photoresist layer. Thereby, the operation is fine, convenient, easy to implement, and a highly accurate source electrode and a highly accurate drain electrode can be obtained.

Step S700: depositing a passivation layer covering the source electrode and the drain electrode on an upper surface of the insulation interlayer.

According to an embodiment of the present disclosure, the passivation layer is same as that described above, and thus will not be repeatly described in detail herein. After the passivation layer is formed, the surface of the TFT is relatively flat, and the passivation layer can serve to protect the TFT.

According to an embodiment of the present disclosure, a method of depositing a passivation layer includes, but is not limited to, chemical vapor deposition, magnetron sputtering, atomic layer deposition, and the like. Thereby, the operation is fine, convenient, easy to implement, and a passivation layer having a relatively flat surface can be obtained.

In another aspect of the present disclosure, an array substrate is provided. According to an embodiment of the present disclosure, the array substrate includes the TFT described above. The array substrate has a fine structure and a high yield, and has all features and advantages of the TFT described above, and thus will not be repeatly described herein.

According to an embodiment of the present disclosure, the array substrate includes a plurality of TFTs arranged in an array, and further includes a structure such as a wire, which is not particularly limited herein.

In another aspect of the present disclosure, a display device is provided. According to an embodiment of the present disclosure, the display device includes the array substrate described above. The display device has a high product yield and a high display quality, can satisfy the consumer's consumption experience, and has strong market competitiveness.

According to the embodiment of the present disclosure, the specific type of the display device has no limitation, and a person skilled in the art can flexibly select the specific type of the display device according to actual conditions. For example, the display device may include, but is not limited to, a display device having a display function such as a mobile phone, a television, a tablet computer, a game machine, etc. Besides the display back plate described above, the display device further includes structures or parts necessary for the display device in the related art. Taking a mobile phone as an example, besides the display back plate described above, it further includes a color filter layer, a cover plate, a touch module, a CPU, a camera module, and the like.

According to an embodiment of the present disclosure, in the TFT of the related art, a contact distance between the conductive region and the channel region in the active layer is long, so that the probability of non-uniformity of conductivity during the conductivity-enabling process is high, and a width of the channel region is not uniform. As a result, the threshold voltage of the TFT is not uniform and the channel region is easy to be subjected to a conductivity-enabling process, thereby affecting the use of the TFT. In contrast, in the present application, by reducing the contact distance between the conductive region and the channel region, the probability of non-uniformity of conductivity during the conductivity-enabling process is reduced, so that the width of the channel region is relatively uniform, and thus the threshold voltage of the TFT is relatively uniform and the channel region is almost non-conductive, and the TFT is preferable in performance.

In the description of the present disclosure, it is to be understood that the term "center", "longitudinal", "transverse", "length", "width", "thickness", "up", "down", "front", "back", "left", "right", "vertical", "horizontal", "top", "bottom", "inside", "outside", "clockwise", "counter-clockwise", "axial", "radial", "circumferential" or the like indicating an orientation or positional relationship is based on the orientation or positional relationship shown in the drawings, and is merely for the convenience of describing the present disclosure and the simplified description, and is not intended to indicate or imply that the indicated device or element has a specific orientation, or the indicated device or element is constructed and operated in a specific orientation. As a result, such term is not to be construed as limiting the present disclosure.

Moreover, the terms "first" and "second" are used for descriptive purposes only and are not to be construed as indicating or implying a relative importance or implicitly indicating the number of technical features. Thus, features with the terms of "first" and "second" may include one or more of the features either explicitly or implicitly. In the description of the present disclosure, unless specifically defined otherwise, the meaning of "a plurality" is two or more.

In the present disclosure, unless specifically defined otherwise, such terms as "installing", "connecting", "coupling", and "fixing" are to be understood broadly. For example, the connection may be either a fixed connection or a detachable connection, or may be integrated, which can be a mechanical connection or an electrical connection, and can be directly connected or indirectly connected through an intermediate medium, and can be an internal communication of two elements or an interaction of two elements. The specific meanings of the above terms in the present disclosure can be understood by a person skilled in the art according to specific situations.

In the present disclosure, unless specifically defined otherwise, the first feature being "on" or "under" the second feature may indicate that the first feature is in direct contact with the second feature, or the first feature is in contact with the second feature through an intermediate medium. Moreover, the first feature being "above" or "over" the second feature may indicate that the first feature is right above or obliquely above the second feature, or indicate merely that the first feature is higher than the second feature horizontally. The first feature being "under" and "below" the second feature may indicate that the first feature is right below or obliquely below the second feature, or indicate merely that the first feature lower than the second feature horizontally.

In the description of the present specification, such terms as "one embodiment", "some embodiments", "an example", "a specific example", or "some examples" may indicate that a specific feature, structure, material, or feature described in connection with the embodiment or the example is included in at least one embodiment or example of the present disclosure. In the present specification, the above terms are not necessarily referred to a same embodiment or example. Furthermore, the particular features, structures, materials, or features described above may be combined in a suitable manner in any one or more embodiments or examples. In addition, unless being contradictory, a person skilled in the art may combine various embodiments or examples described in the specification and features of various embodiments or examples.

Although the embodiments of the present disclosure have been shown and described above, it is understood that the foregoing embodiments are illustrative and are not to be construed as limiting the scope of the present disclosure. A person skilled in the art may make various modifications and substitutions of the above-described embodiments within the scope of the present disclosure.

What is claimed is:

1. A Thin Film Transistor (TFT), comprising an active layer and a base, wherein
   the active layer is arranged on a surface of the base;
   the active layer comprises a channel region, a first conductive region and a second conductive region, and the channel region is arranged between the first conductive region and the second conductive region,
   wherein the channel region comprises a first side and a second side, the first side is opposite to the second side, the first side is in direct physical contact with a third side of the first conductive region, the second side is in direct physical contact with a fourth side of the second conductive region, and a length of the first side is greater than a length of the third side;
   a material of the active layer in the first conductive region is different from a material of the active layer in the channel region, and a material of the active layer in the second conductive region is different from the material of the active layer in the channel region;
   a shape of an orthographic projection of the first conductive region onto the base is a trapezium, and a shape of an orthographic projection of the second conductive region onto the base is another trapezium.

2. The TFT according to claim 1, wherein an entirety of the third side is in direct physical contact with the first side.

3. The TFT according to claim 1, wherein a length of the second side is greater than a length of the fourth side.

4. The TFT according to claim 3, wherein an entirety of the fourth side is in direct physical contact with the second side.

5. The TFT according to claim 1, wherein a length of the second side is equal to a length of the fourth side.

6. The TFT according to claim 5, wherein an entirety of the fourth side is in direct physical contact with the second side.

7. The TFT according to claim 1, wherein a length of the third side is equal to a length of the fourth side.

8. The TFT according to claim 1, wherein a length of the third side is not equal to a length of the fourth side.

9. The TFT according to claim 1, further comprising:
   a gate insulation layer arranged on a surface of the channel region distal to the base;

a gate electrode arranged on a surface of the gate insulation layer distal to the channel region;

an insulation interlayer, wherein the insulation interlayer is arranged on the surface of the base, and covers the active layer, the gate insulation layer, and the gate electrode;

a source electrode and a drain electrode, wherein the source electrode and the drain electrode are arranged on a surface of the insulation interlayer distal to the base, the source electrode is electrically connected to the first conductive region through a first via hole, and the drain electrode is electrically connected to the second conductive region through a second via hole; and a passivation layer, wherein the passivation layer is arranged on a surface of the insulation interlayer distal to the base, and covers the source electrode and the drain electrode.

10. A method for manufacturing the TFT according to claim 1, comprising forming the active layer of the TFT, wherein forming the active layer of the TFT comprising:

forming a semiconductor pattern layer on a surface of a base by a first patterning process;

forming a gate insulation layer and a gate electrode by a second patterning process, wherein the gate insulation layer is arranged on a surface of the semiconductor pattern layer distal to the base, and the gate electrode is arranged on a surface of the gate insulation layer distal to the base;

subjecting a portion of the semiconductor pattern layer not covered by the gate insulation layer to a conductivity-enabling process, to enable the portion of the semiconductor pattern layer to be conductive.

11. The method according to claim 10 wherein the second patterning process comprises:

depositing an insulation layer on the surface of the base, wherein the insulation layer covers the semiconductor pattern layer;

depositing a conductive layer on a surface of the insulation layer distal to the base; and subjecting the insulation layer and the conductive layer to a patterning process by using a same mask.

12. The method according to claim 11, further comprising:

depositing an insulation interlayer on the surface of the base, wherein the insulation interlayer covers the active layer, the gate insulation layer, and the gate electrode;

etching the insulation interlayer to form a first via hole and a second via hole;

forming a source electrode and a drain electrode on a surface of the insulation interlayer distal to the base by a third patterning process, wherein the source electrode is electrically connected to the first conductive region through the first via hole, and the drain electrode is electrically connected to the second conductive region through the second via hole; and depositing a passivation layer on a surface of the insulation interlayer distal to the base, wherein the passivation layer covers the source electrode and the drain electrode.

13. An array substrate, comprising the TFT according to claim 1.

14. The array substrate according to claim 13, wherein an entirety of the third side is in direct physical contact with the first side.

15. The array substrate according to claim 13, wherein a length of the second side is greater than a length of the fourth side.

16. The array substrate according to claim 15, wherein an entirety of the fourth side is in direct physical contact with the second side.

17. A display device, comprising the array substrate according to claim 13.

18. The display device according to claim 17, wherein an entirety of the third side is in direct physical contact with the first side.

19. The display device according to claim 17, wherein a length of the second side is greater than a length of the fourth side.

20. The display device according to claim 19, wherein an entirety of the fourth side is in direct physical contact with the second side.

* * * * *